(12) United States Patent
Gutwin et al.

(10) Patent No.: US 11,723,187 B2
(45) Date of Patent: Aug. 8, 2023

(54) THREE-DIMENSIONAL MEMORY CELL STRUCTURE

(71) Applicant: Tokyo Electron Limited, Tokyo (JP)

(72) Inventors: Paul Gutwin, Williston, VT (US); Lars Liebmann, Mechanicsville, NY (US); Daniel Chanemougame, Niskayuna, NY (US)

(73) Assignee: Tokyo Electron Limited, Tokyo (JP)

( * ) Notice: Subject to any disclaimer, the term of this patent is extended or adjusted under 35 U.S.C. 154(b) by 33 days.

(21) Appl. No.: 17/644,982

(22) Filed: Dec. 17, 2021

(65) Prior Publication Data

US 2022/0302121 A1 Sep. 22, 2022

Related U.S. Application Data

(60) Provisional application No. 63/161,538, filed on Mar. 16, 2021.

(51) Int. Cl.
| | |
|---|---|
| *H10B 12/00* | (2023.01) |
| *G11C 11/402* | (2006.01) |
| *G11C 11/412* | (2006.01) |
| *H10B 10/00* | (2023.01) |

(52) U.S. Cl.
CPC .......... *H10B 12/30* (2023.02); *G11C 11/4023* (2013.01); *G11C 11/412* (2013.01); *H10B 10/12* (2023.02); *H10B 12/02* (2023.02)

(58) Field of Classification Search
None
See application file for complete search history.

(56) References Cited

U.S. PATENT DOCUMENTS

| 9,502,094 B2 | 11/2016 | Onuki |
| 9,870,816 B2 | 1/2018 | Onuki et al. |
| 9,935,204 B2 | 4/2018 | Lee et al. |
| 9,997,598 B2 | 6/2018 | Smith et al. |
| 10,374,099 B2 | 8/2019 | Lee et al. |
| 10,453,850 B2 | 10/2019 | Smith et al. |
| 10,529,830 B2 | 1/2020 | Tapily et al. |
| 10,573,655 B2 | 2/2020 | Smith et al. |

(Continued)

OTHER PUBLICATIONS

International Search Report and Written Opinion dated May 9, 2022 in PCT/US2022/012487, 8 pages.

*Primary Examiner* — Nicholas J Tobergte
*Assistant Examiner* — Kevin Quinto
(74) *Attorney, Agent, or Firm* — Oblon, McClelland, Maier & Neustadt, L.L.P.

(57) ABSTRACT

In a semiconductor device, a first stack is positioned over substrate and includes a first pair of transistors and a second pair of transistors stacked over the substrate. A second stack is positioned over the substrate and adjacent to the first stack. The second stack includes a third pair of transistors and a fourth pair of transistors stacked over the substrate. A first capacitor is stacked with the first and second stacks. A second capacitor is positioned adjacent to the first capacitor and stacked with the first and second stacks. A first group of the transistors in the first and second stacks is coupled to each other to form a static random-access memory cell. A second group of the transistors in the first and second stacks is coupled to the first and second capacitors to form a first dynamic random-access memory (DRAM) cell and a second DRAM cell.

20 Claims, 6 Drawing Sheets

(56) References Cited

U.S. PATENT DOCUMENTS

| | | |
|---|---|---|
| 10,741,676 B2 | 8/2020 | Lee et al. |
| 10,833,078 B2 | 11/2020 | Smith et al. |
| 10,930,764 B2 | 2/2021 | Tapily et al. |
| 10,964,706 B2 | 3/2021 | Smith et al. |
| 2008/0099812 A1* | 5/2008 | Nagata .................. H10B 12/50 257/E27.084 |
| 2013/0314976 A1 | 11/2013 | Onuki |
| 2015/0117093 A1 | 4/2015 | Onuki et al. |
| 2017/0162583 A1 | 6/2017 | Lee et al. |
| 2018/0026042 A1 | 1/2018 | Smith et al. |
| 2018/0040695 A1 | 2/2018 | Smith et al. |
| 2018/0047832 A1 | 2/2018 | Tapily et al. |
| 2018/0190835 A1 | 7/2018 | Lee et al. |
| 2018/0240802 A1 | 8/2018 | Smith et al. |
| 2019/0172828 A1 | 6/2019 | Smith et al. |
| 2019/0319137 A1 | 10/2019 | Lee et al. |
| 2019/0326301 A1 | 10/2019 | Smith et al. |
| 2020/0098897 A1 | 3/2020 | Tapily et al. |
| 2020/0357932 A1 | 11/2020 | Lee et al. |
| 2021/0028169 A1 | 1/2021 | Smith et al. |

* cited by examiner

THREE-DIMENSIONAL MEMORY CELL STRUCTURE

CROSS REFERENCE TO RELATED APPLICATIONS

This present application claims the benefit of priority to U.S. Provisional Application No. 63/161,538 filed on Mar. 16, 2021, which is incorporated by reference herein in its entirety.

FIELD OF THE INVENTION

The disclosure relates to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

Techniques herein include a new memory cell. One embodiment includes a memory cell containing a single SRAM bit cell, and two DRAM cells for a total of three bit storage. Another embodiment includes a space-efficient layout of transistors to implement the three bit storage cell in the same footprint that would be used for a single SRAM bit cell (in CFET technology). Another embodiment includes efficient use of the space below the memory cell for the DRAM capacitors (in CFET technology with buried power rails).

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to an aspect of the disclosure, a semiconductor device is provided. The semiconductor device can include a first stack of transistors positioned over a top surface of a substrate. The first stack of transistors can include a first pair of transistors and a second pair of transistors that are stacked over the substrate. The semiconductor device can include a second stack of transistors positioned over the top surface of the substrate and adjacent to the first stack of transistors. The second stack of transistors can include a third pair of transistors and a fourth pair of transistors that are stacked over the substrate. The semiconductor device can include a first capacitor that is stacked with the first stack of transistors and the second stack of transistors. The semiconductor device can also include a second capacitor that is positioned adjacent to the first capacitor and stacked with the first stack of transistors and the second stack of the transistors. In the semiconductor device, a first group of the transistors in the first stack of transistors and the second stack of transistors can be coupled to each other to form a static random-access memory (SRAM) cell. In addition, a second group of the transistors in the first stack of the transistors and the second stack of transistor are coupled to the first capacitor and the second capacitor to form a first a dynamic random-access memory (DRAM) cell and a second DRAM cell that are stacked with and coupled to the SRAM cell.

In some embodiments, the first pair of transistors can include a first transistor over the substrate and a second transistor over the first transistor. The second pair of transistors can include a third transistor over the second transistor and a fourth transistor over the third transistor. The third pair of transistors can include a fifth transistor over the substrate and a sixth transistor over the fifth transistor, and the fourth pair of transistors can include a seventh transistor over the sixth transistor and an eighth transistor over the seventh transistor.

In some embodiments, each of the transistors in the first and second stacks can include one or more channel regions and a gate region. The one or more channel regions can extend along a horizontal direction parallel to the top surface of the substrate, be stacked over the substrate along a vertical direction perpendicular to the top surface of the substrate, and be spaced apart from each other. The gate region can be around the one or more channel regions.

In some embodiments, the first group of the transistors in the first stack of transistors and the second stack of transistors can include the second, third, fourth, sixth, seventh, and eighth transistors. The second group of the transistors in the first stack of transistors and the second stack of transistors can include the first and fifth transistors.

In some embodiments, the first capacitor can have a trench profile, extend into the substrate from the top surface of the substrate, and be positioned in the substrate. The second capacitor can have a trench profile, extend into the substrate from the top surface of the substrate, and be positioned in the substrate. The first capacitor can be coupled to the first transistor to form the first DRAM cell, and the second transistor can be coupled to the fifth transistor to form the second DRAM cell.

The second transistor can be a n-type transistor and the third transistor can be a p-type transistor, where the second and third transistors can form a first invertor structure of the SRAM cell. The sixth transistor can be a n-type transistor and the seventh transistor can be a p-type transistor, where the sixth and seventh transistors can form a second invertor structure of the SRAM cell. The first invertor structure and the second invertor structure can be cross-coupled. The fourth transistor can be a n-type transistor that functions as a first access transistor of the SRAM cell and coupled to the first invertor structure, and the eighth transistor can be a n-type transistor that functions as a second access transistor of the SRAM cell and coupled to the second invertor structure.

The semiconductor device can include a first buried power rail (BPR) that is positioned in the substrate, adjacent to and coupled to the first capacitor, and applied with a source supply voltage (VSS). The semiconductor can include a second BPR that is positioned in the substrate, coupled to a source region of the third transistor and a source region of the seventh transistor, and applied with a drain supply voltage (VDD). The semiconductor device can also include a third BPR that is positioned in the substrate, adjacent to and coupled to the second capacitor, and applied with the VSS. In some embodiments, the second BPR can be arranged between the first and third BPRs.

The semiconductor device can include a first interconnect structure that functions as a first bit line and is coupled to a source region of the first transistor and a source region of the fourth transistor. The semiconductor device can include a second interconnect structure that functions as a second bit line and is coupled to a source region of the fifth transistor and a source region of the eighth transistor. The semiconductor device can include a third interconnect structure that functions as a word line for the SRAM cell and is coupled to a gate region of the fourth transistor and a gate region of the eighth transistor. The semiconductor device can include a fourth interconnect structure that functions as a word line for the first DRAM cell and is coupled to a gate region of the first transistor. The semiconductor device can also include a fifth interconnect structure that functions as a word line for the second DRAM cell and is coupled to a gate region of the fifth transistor.

In some embodiments, the first group of the transistors in the first stack of transistors and the second stack of transistors can include the first, second, third, fifth, sixth, and seventh transistors. The second group of the transistors in the first stack of transistors and the second stack of transistors can include the fourth and eighth transistors.

In some embodiments, the first transistor can be a n-type transistor and the second transistor can be a p-type transistor, where the first and second transistors can forming a first invertor structure of the SRAM cell. The fifth transistor can be a n-type transistor and the sixth transistor can be a p-type transistor, where the fifth and sixth transistors can form a second invertor structure of the SRAM cell. The first invertor structure and the second invertor structure can further be cross-coupled. The third transistor can be a n-type transistor that functions as a first access transistor of the SRAM cell and coupled to the first invertor structure, and the seventh transistor can be a n-type transistor that functions as a second access transistor of the SRAM cell and coupled to the second invertor structure.

In some embodiments, the first capacitor can be positioned over the fourth transistor and have one of a trench profile extending in the vertical direction and a plate profile extending in the horizontal direction. The second capacitor can be positioned over the eighth transistor and have one of a trench profile extending in the vertical direction and a plate profile extending in the horizontal direction. The first capacitor can be coupled to the fourth transistor to form the first DRAM cell, and the second capacitor can be coupled to the eighth transistor to form the second DRAM cell.

The semiconductor device can further include a first interconnect structure that functions as a first bit line and is coupled to a source region of the third transistor and a source region of the fourth transistor. The semiconductor device can include a second interconnect structure that functions as a second bit line and is coupled to a source region of the seventh transistor and a source region of the eighth transistor. The semiconductor device can include a third interconnect structure that functions as a word line for the SRAM cell and is coupled to a gate region of the third transistor and a gate region of the seventh transistor. The semiconductor device can include a fourth interconnect structure that functions as a word line for the first DRAM cell and is coupled to a gate region of the fourth transistor. The semiconductor device can include a fifth interconnect structure that functions as a word line for the second DRAM cell and is coupled to a gate region of the eighth transistor.

In some embodiments, the semiconductor device can include a first BPR that is positioned in the substrate, coupled to the first capacitor, and applied with the VSS. The semiconductor device can include a second BPR that is positioned in the substrate, coupled to a source region of the second transistor and a source region of the sixth transistor, and applied with the VDD. The semiconductor device can also include a third BPR that is positioned in the substrate, coupled to the second capacitor, and applied with the VSS. In some embodiments, the second BPR can be arranged between the first and second BPRs.

According to another aspect of the disclosure, a method of manufacturing a semiconductor device is provided. In the method, a first stack of transistors can be formed over a top surface of a substrate, where the first stack of transistors can include a first pair of transistors and a second pair of transistors that are stacked over the substrate. A second stack of transistors can be formed over the substrate and adjacent to the first stack of transistors, where the second stack of transistors can include a third pair of transistors and a fourth pair of transistors that are stacked over the substrate. A first capacitor can be formed to be stacked with the first stack of transistors and the second stack of the transistors. A second capacitor can be formed adjacent to the first capacitor and stacked with the first stack of transistors and the second stack of the transistors. A first group of the transistors in the first stack of transistors and the second stack of transistors can be coupled to each other to form a SRAM cell. A second group of the transistors in the first stack of the transistors and the second stack of transistor can be coupled to the first capacitor and the second capacitor to form a first a DRAM cell and a second DRAM cell that are stacked with and coupled to the SRAM cell.

In some embodiments, the first pair of transistors can include a first transistor over the substrate and a second transistor over the first transistor. The second pair of transistors can include a third transistor over the second transistor and a fourth transistor over the third transistor. The third pair of transistors can include a fifth transistor over the substrate and a sixth transistor over the fifth transistor. The fourth pair of transistors can include a seventh transistor over the sixth transistor and an eighth transistor over the seventh transistor.

In some embodiments, each of the transistors in the first and second stacks can includes one or more channel regions and a gate region. The one or more channel regions can extend along a horizontal direction parallel to the top surface of the substrate, be stacked over the substrate along a vertical direction perpendicular to the top surface of the substrate, and be spaced apart from each other. The gate region can be around the one or more channel regions.

In order to forming the first and second capacitors, the first capacitor can be formed to have a trench profile, extend into the substrate from the top surface of the substrate, and be positioned in the substrate. The second capacitor can be formed to have a trench profile, extend into the substrate from the top surface of the substrate, and be positioned in the substrate. The first capacitor can be coupled to the first transistor to form the first DRAM cell, and the second transistor can be coupled to the fifth transistor to form the second DRAM cell.

In some embodiments, the second transistor can be a n-type transistor and the third transistor can be a p-type transistor, where the second and third transistors can forming a first invertor structure of the SRAM cell. The sixth transistor can be a n-type transistor and the seventh transistor can be a p-type transistor, where the sixth and seventh transistors can form a second invertor structure of the SRAM cell. The first invertor structure and the second invertor structure can further be cross-coupled. The fourth transistor can be a n-type transistor that functions as a first access transistor of the SRAM cell and coupled to the first invertor structure, and the eighth transistor can be a n-type transistor that functions as a second access transistor of the SRAM cell and coupled to the second invertor structure.

In the method, a first BPR can be formed to be positioned in the substrate, adjacent to and coupled to the first capacitor, and applied with the VSS. A second BPR can be formed to be positioned in the substrate, coupled to a source region of the third transistor and a source region of the seventh transistor, and applied with the VDD. A third BPR can be formed to be positioned in the substrate, adjacent to and coupled to the second capacitor, and applied with the VSS. In some embodiments, the second BPR can be arranged between the first and third BPRs.

In the method, a first interconnect structure can be formed to function as a first bit line and be coupled to a source region of the first transistor and a source region of the fourth transistor. A second interconnect structure can be formed to function as a second bit line and be coupled to a source region of the fifth transistor and a source region of the eighth transistor. A third interconnect structure can be formed to function as a word line for the SRAM cell and be coupled to a gate region of the fourth transistor and a gate region of the eighth transistor. A fourth interconnect structure can be formed to function as a word line for the first DRAM cell and be coupled to a gate region of the first transistor. A fifth interconnect structure can be formed to function as a word line for the second DRAM cell and be coupled to a gate region of the fifth transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
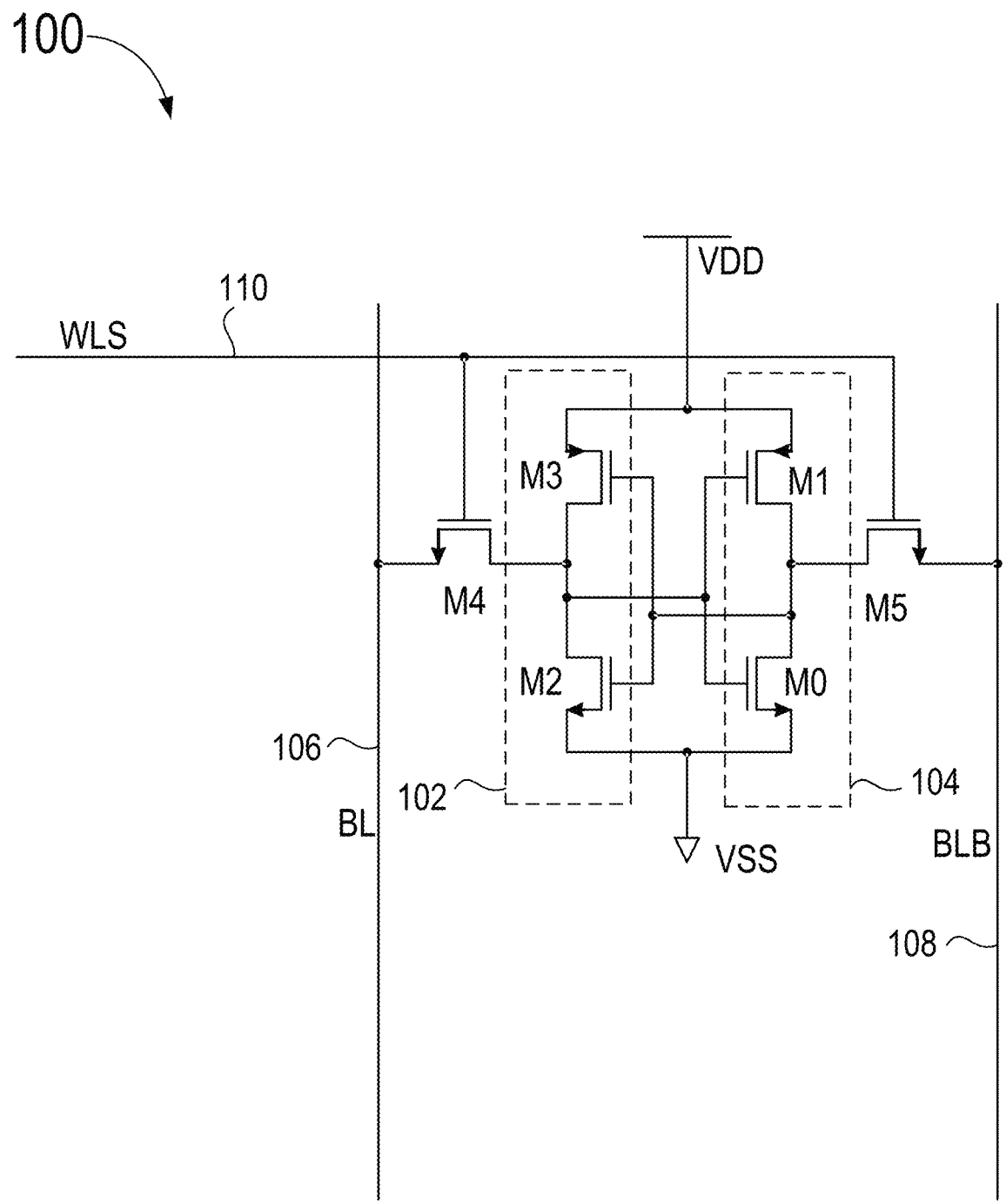
FIG. 1 is a schematic circuit diagram of a static random-access memory (SRAM) memory cell, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

Techniques herein include a novel combination of an SRAM cell with two DRAM bit cells in a space efficient layout. Static Random Access Memory (SRAM) cells are well known. A conventional SRAM bit cell is comprised of a pair of inverters cross-coupled to provide an electrically stable circuit for storing one bit of data. The pair of inverters are connected to two bit line signals (e.g., BL, BLB) using two separate transistors. This is commonly known as a six transistor or "6T" bit cell. An exemplary schematic circuit diagram of a SRAM cell 100 can be shown in FIG. 1. As shown in FIG. 1, the SRAM cell 100 can include a n-type transistor M2 and a p-type transistor M3 that can form a first inverter 102. The SRAM cell 100 can include a n-type transistor M0 and a p-type transistor M1 that can form a second inverter 104. The first inverter 102 and the second inverter 104 can be crossed-coupled. For example, a gate terminal of the transistor M3 and a gate terminal of the transistor M2 can be coupled to a drain terminal of the transistor M1 and a drain terminal of the transistor M0. A gate terminal of the transistor M1 and a gate terminal of the transistor M0 can be coupled to a drain terminal of the transistor M3 and a drain terminal of the transistor M2. The SRAM cell 100 can also include a first access transistor M4 and a second access transistor M5. The transistor M4 can be a n-type transistor and coupled to the first inverter 102. The transistor M5 can be a n-type transistor and coupled to the second inverter 104. The SRAM cell can also include a first bit line BL 106 that is coupled to a source terminal of the transistor M4, and a second bit line BLB that is coupled to a source terminal of the transistor M5. The SRAM cell 100 can include a word line WLS 110 that is coupled to a gate terminal of the transistor M4 and a gate terminal of the transistor M5 to control the transistor M4 and the transistor M5. The SRAM cell 100 can be applied with operation voltages. For example, a drain supply voltage (VDD) can be applied to a source terminal of the transistor M3 and a source terminal of the transistor M1. A source supply voltage (VSS) can be applied to a source terminal of the transistor M2 and a source terminal of the transistor M0.

Figure 2:
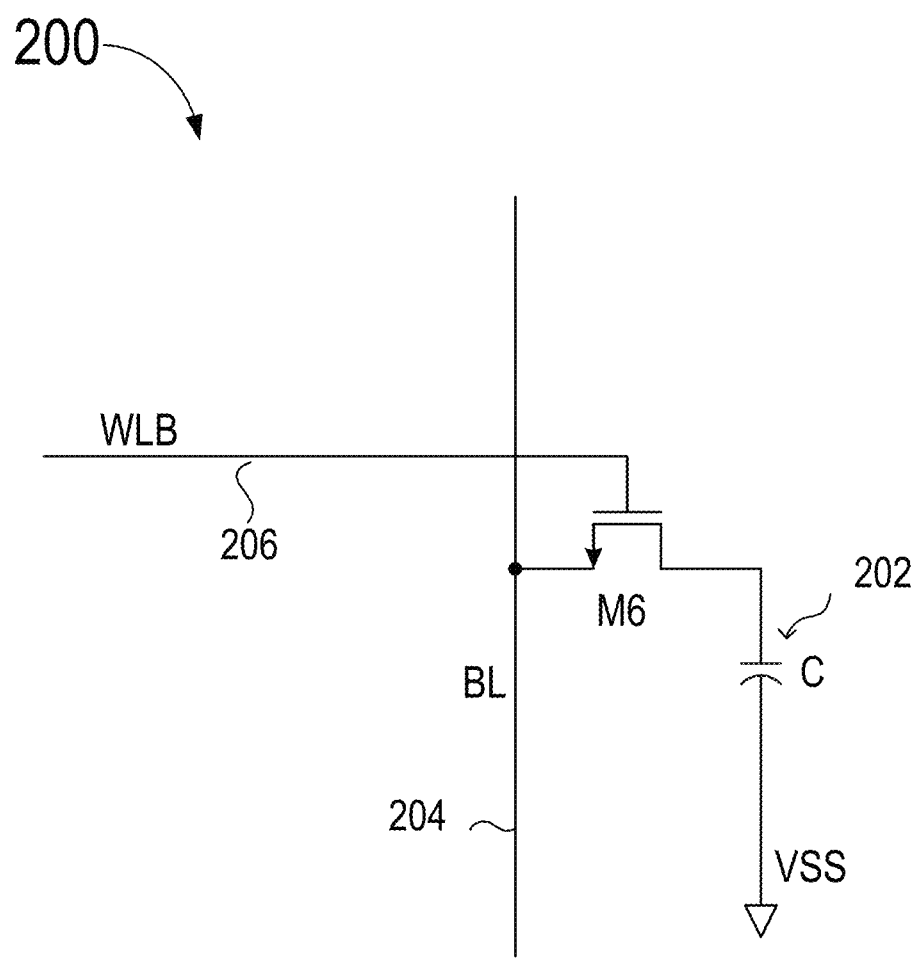
FIG. 2 is schematic circuit diagram of a dynamic random-access memory (DRAM) memory cell, in accordance with some embodiments.

Dynamic Random Access Memory (DRAM) cell is also well known. A conventional DRAM cell can include a single transistor connected to a capacitor. An exemplary schematic circuit diagram of a DRAM cell 200 can be shown in FIG. 2. As shown in FIG. 2, the DRAM cell 200 can include an access transistor M6 and a capacitor 202 that are coupled to each other. For example, a source terminal of the transistor M6 can be coupled to a positive polarity of the capacitor 202. The DRAM cell 200 can also include a word line 206 coupled to a gate terminal of M6 and a bit line 204 coupled to a source terminal of the transistor M6. A negative polarity of the capacitor 202 can be further coupled to VSS. In a memory cell, a word line provides a current to select which row of bits (or memory cells) is to be read or written. A bit line either reads a bit (or memory cell) on a corresponding word line or allows a current applied to the bit line to program the bit (or memory cell). Accordingly, a particular cell is selected for reading or writing by acting it is word line and bit line.

Typically, both SRAM and DRAM cells are used in computational systems (e.g., microprocessors) in tiers or levels of cache, with the fastest (SRAM) cell being located very close to the computational elements of the processor, and the DRAM cell being used in some lower level, such as tertiary level of cache.

A typical processor cache subsystem can have an SRAM cache as level 1 and level 2, and a DRAM cache as level 3. A level 1 cache miss (e.g., attempting to access a data element not present in the cache) can force a fetch from the level 2 cache. A miss in the level 2 cache can force a fetch from the level 3 cache. While details vary between processors, it is relatively common to have a 1 to 10 to 100 ratios between access times for L1, L2, and L3 caches. For example, a L1 cache miss can impose a 10× time penalty. As can be appreciated, time penalties increase with cache levels.

Extensive effort has been required to optimize the size and speed of the cache subsystem for a specific processor. Processors, however, are limited in their performance by the so-called "memory wall" that is a growing disparity of speed between CPU and memory outside the CPU chip. A crucial element of the memory wall is the speed/density trade off of the SRAM and DRAM cells. Minor (single digit percentage) reductions in the area of the SRAM cell can lead to larger cache sizes and can have a dramatic impact on the overall processor performance. It is therefore an objective of this disclosure to introduce a new memory cell that combines a single SRAM cell with two DRAM cells in a space-efficient layout.

Figure 3:
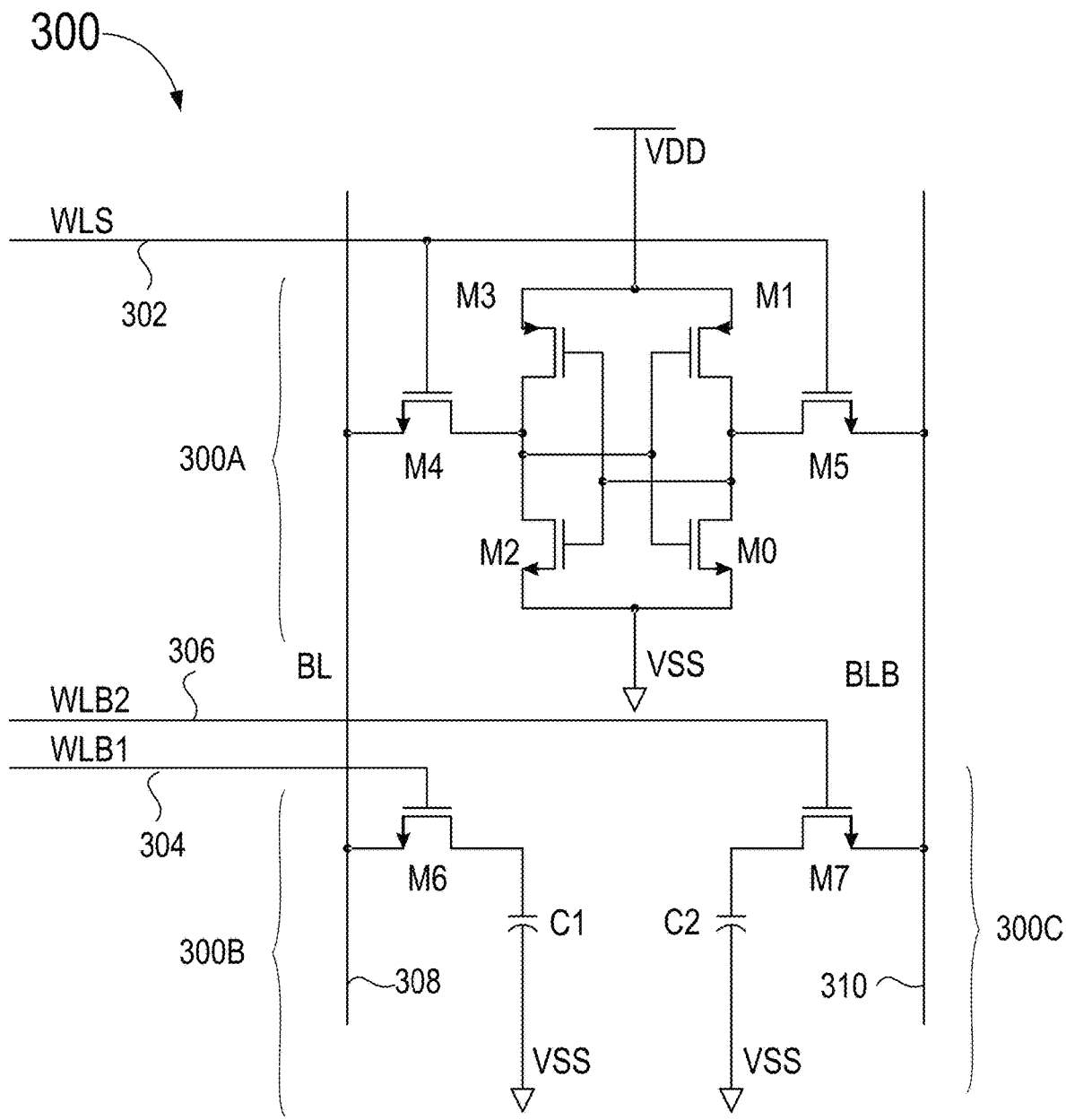
FIG. 3 is a schematic circuit diagram of a memory cell based on a combination of a SRAM memory cell and DRAM memory cells, in accordance with some embodiments.

FIG. 3 illustrates a circuit diagram for a memory cell 300 disclosed herein. As shown in FIG. 3, the memory cell 300 can be formed based on a combination of a SRAM cell 300A and two DRAM cells 300B and 300C. The SRAM cell 300A can be identical to the SRAM cell 100 in FIG. 1 and the two DRAM cells 300B and 300C can be identical to the DRAM cell 200 in FIG. 2. Further, the memory cell 300 can include a first word line WLS 302 coupled to a gate terminal of the transistor M4 and a gate terminal of the transistor M5, a second word line WLB1 304 coupled to a gate terminal of the transistor M6, and a third word line WLB2 306 coupled to a gate terminal of the transistor M7. The memory cell 300 can also include a first bit line BL 308 that is coupled to a source terminal of the transistor M6 and a source terminal of the transistor M4, a second bit line BLB 310 that is coupled to a source terminal of the transistor M7 and a source terminal of the transistor M5.

The SRAM and DRAM elements (e.g., 300A, 300B, and 300C) of the design herein can function in a same manner as the SRAM and DRAM elements would in a conventional and separate configuration. Detailed operation of the memory cell 300 can be described as follows. During a quiescent operation (e.g., no activity in the memory cells 300A-300C), the word lines WLS 302, WLB1 304 and WLB2 306 can be held at a ground voltage. For a read/write operation to the SRAM bit cell (or SRAM cell) 300A, the first word line WLS 302 can be held at VDD, and the first bit line BL 308 and the second bit line BLB 310 can be conditioned as would be typically done with an SRAM cell. For a read/write operation to the DRAM cells 300B and 300C, one or both of the word lines WLB1 304 and WLB2 306 can be held at VDD. The first bit line BL 308 can be used to read or write the value to the DRAM cell 300B and the second bit line BLB 310 can be used to read or write the value to the DRAM cell 300C.

It should be noted the memory cell 300 can further include supporting circuitry for operation. For example, the memory cell 300 can include a pre-charge circuit and a sense amplifier circuit. The pre-charge circuit can pre-charge the bit lines to VDD for faster read and write operations. The sense amplifier circuit is configured to detect what value is stored in the SRAM cell or the DRAM cell during a read operation and displaying that value at an output. The memory cell 300 can further be coupled to a row decoder, a column decoder, or other supporting circuits. The row decoder and the column decoder can help identify a specific SRAM cell or DRAM cell for operation.

Figure 4:
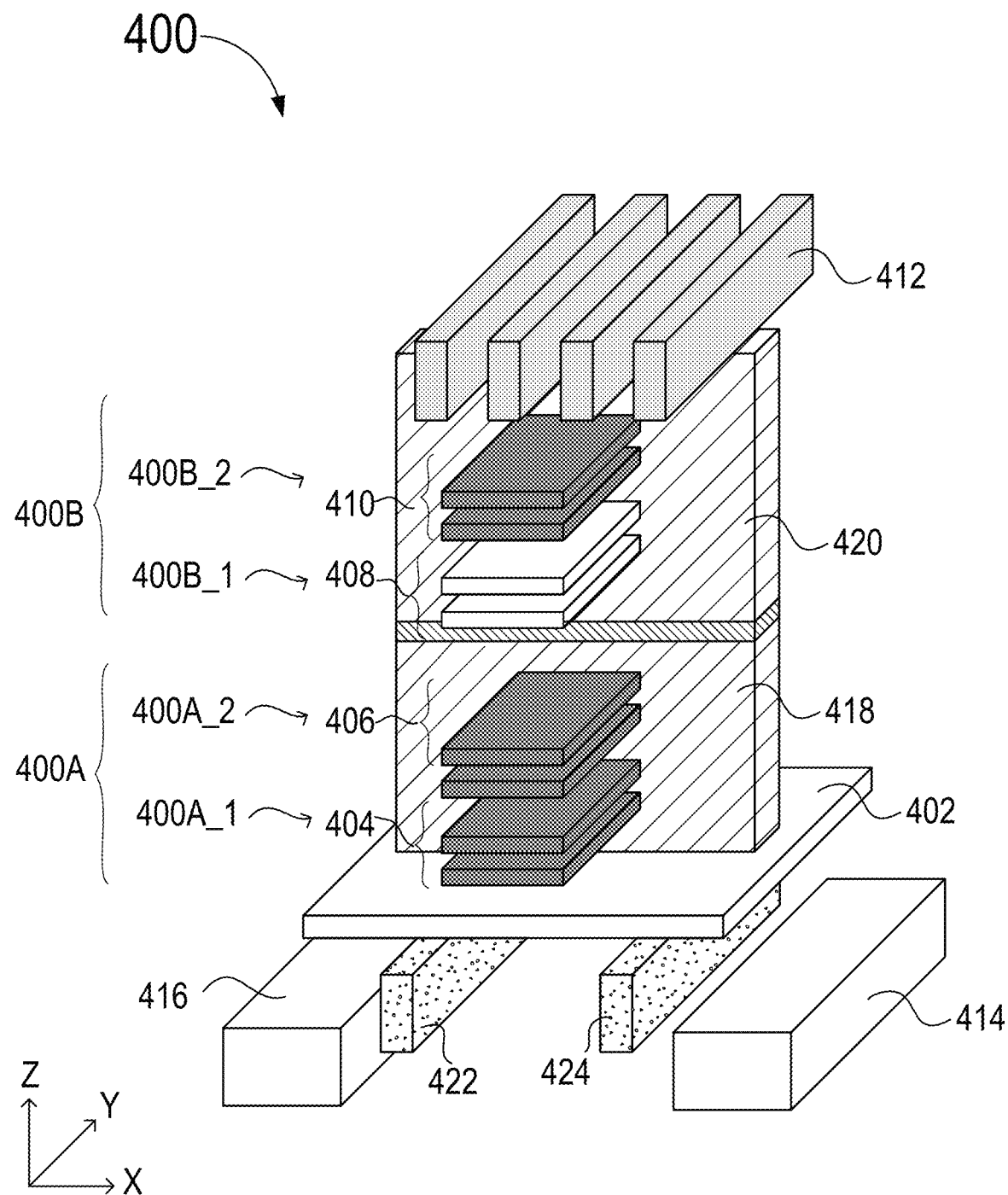
FIG. 4 is a perspective view of a complementary field-effect transistor (CFET) structure, in accordance with some embodiments.

Note that various layouts of the cell can be used. Note also that while a specific technology definition is used to illustrate embodiments herein, techniques herein can be applied to other stackable device technologies. Embodiments herein can be used with a CFET 3.4 device configuration, where the 3 stands for 3 nm manufacturing technology and 4 can stand for two stacked CFETs that include 4 transistors. Further, each of the four transistors can include one or more (e.g., two) nanosheets that function as channel regions, and buried power rails (BPRs) can be positioned below two stacked CFETs. Nanosheets in the two stacked CFETs can be designed to be either NMOS or PMOS. FIG. 4 shows perspective view of the two stacked CFETs formed by the CFET 3.4 technology.

As shown in FIG. 4, a stack of transistors (or stack) 400 can include a first CFET 400A over a substrate 402 and a second CFET 400B stacked over the first CFET 400A. The first CFET 400A can include a first transistor 400A_1 and a second transistor 400A_2 that are stacked over the substrate 402. The second CFET 400B can include a third transistor 400B_1 and a fourth transistor 400B_2 that are stacked over the first CFET 400A. Each of the transistors in the stack 400 can include two nanosheets that function as channel regions and extend along a direction (e.g., Y direction) parallel to the substrate 402. For example, the first transistor 400A_1 can include two nanosheets 404 that are stacked over the substrate 402 and spaced apart from one another. Of course, FIG. 4 is merely an example, and each of the transistors can include any number of nanosheets based on device designs.

Still referring to FIG. 4, each of the CFETs 400A and 400B can also include a gate region that surrounds the nanosheets (or channel regions) of the transistors. For example, the first CFET 400A can include a gate region 418 that surrounds the nanosheets (or channel regions) 404 and 406 respectively. The second CFET 400B can include a gate region 420 that surrounds the nanosheets 408 and 410 respectively. The gate region can include barrier layers, work function layers and gate fillers. The stack 400 can further include a plurality of metal lines (or interconnect structures) 412 positioned over the second CFET 400B and coupled to the transistors (e.g., 400A_1, 400A_2, 400B_1, and 400B_2). The metal lines (or interconnect structures) 412 can function as the bit lines (e.g., 308 and 310) and the word lines (302-306) that are shown in FIG. 3 according to the circuit designs. The stack 400 can further include buried power rails (BPRs) 414 and 416 that are positioned in the substrate 402 and provide operation voltages (e.g., VDD and VSS). In some embodiments, the stack 400 can include one or more deep trench capacitors 422-424 that are positioned in the substrate 402 and arranged adjacent to the BPRs.

The transistors in the stack 400 can be n-type or p-type depends on the circuit designs. In an exemplary embodiment, the transistors 400A_1, 400A_2, and 400B_2 can be n-type, and the transistor 400B_1 can be p-type. Of course, the transistors 400A_1, 400A_2, and 400B_2 can be p-type, and 400B_1 can also be n-type based on the circuit designs.

In a related example, a given SRAM bit cell formed by the CFET 3.4 technology can use two stacks of 3.4 devices (or two stacks of transistors formed by the CFET 3.4 technology) next to each other for a total of 8 devices (or transistors). Each of the two stacks of 3.4 devices can have similar features to the stack 400. However, only 6 of the 8 devices in the two stacks of 3.4 are required for the operation of the SRAM cell, and two of the 8 devices would be unused. In the disclosure, the unused 2 transistors can be applied to form the DRAM cells that are shown in FIG. 3. Accordingly, the memory cell that includes the SRAM cell and two DRAM cells shown in FIG. 3 can be formed by the CFET 3.4 technology.

Figure 5:
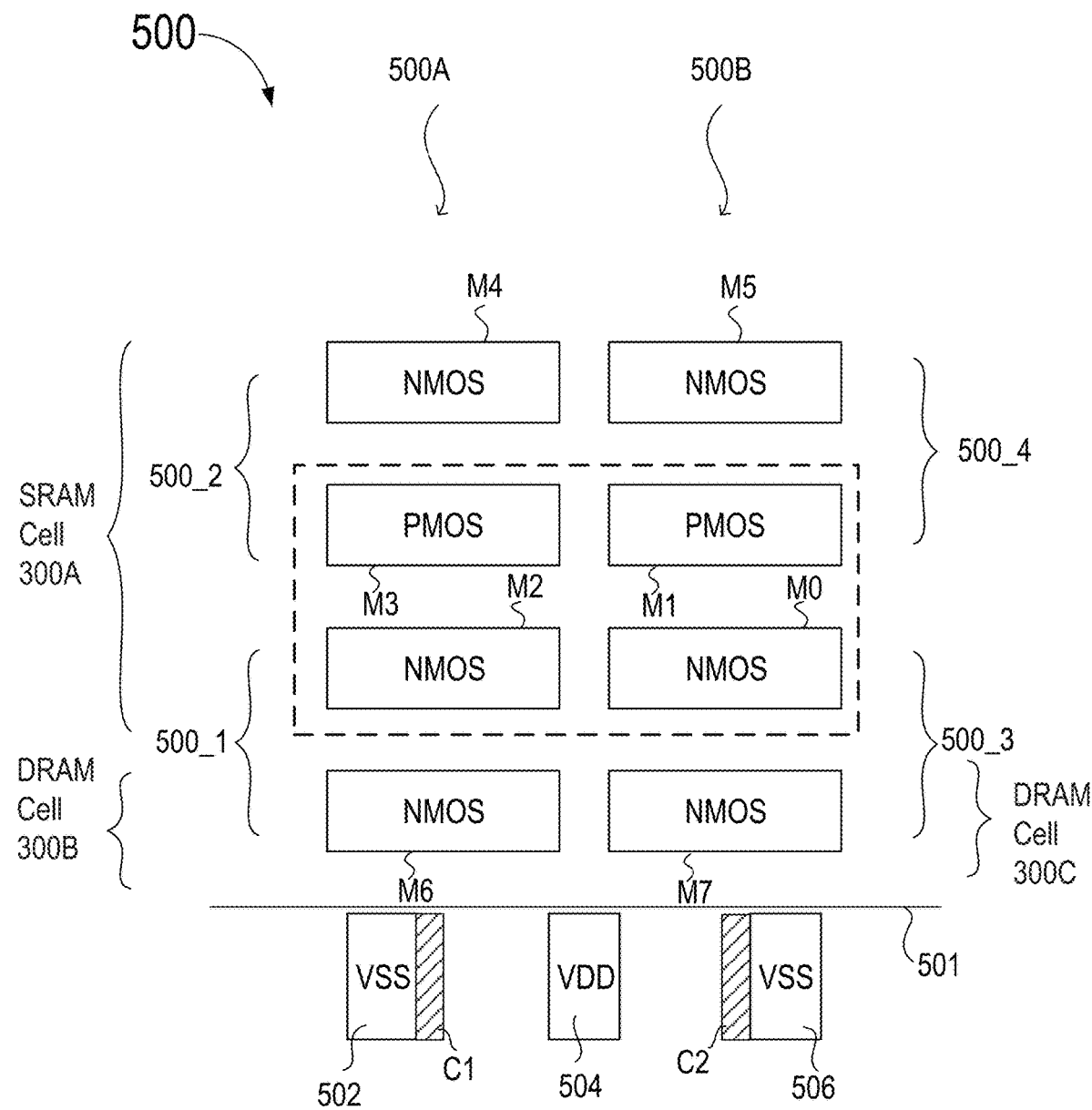
FIG. 5 is a cross-sectional view of a first exemplary memory cell based on a combination of a SRAM memory cell and DRAM memory cells, in accordance with some embodiments.

FIG. 5 shows a first example cross-sectional layout (or layout) 500 of the memory cell 300 that is shown in FIG. 3. As shown in FIG. 5, the memory cell 300 can be formed based on two stack of transistors (or stacks) 500A and 500B. Each of the stacks 500A and 500B can have similar configures to the stack 400. The stack 500A can include a first CFET that includes a first pair of transistors 500_1 over a substrate 501 and a second CFET that includes a second pair of transistors 500_2 over the first pair of transistors 500_1. The first pair of transistors 500_1 can includes a first transistor M6 over the substrate 501 and a second transistor M2 over the first transistor M6. The second pair of transistors 500_2 includes a third transistor M3 over the second transistor M2 and a fourth transistor M4 over the third transistor M3. The stack 500B can include a third CFET that includes a third pair of transistors 500_3 over the substrate 501 and a fourth CFET that includes a fourth pair of transistors 500_4 over the third pair of transistors 500_3. The third pair of transistors 500_3 can includes a fifth transistor M7 over the substrate 501 and a sixth transistor M0 over the first transistor M7. The fourth pair of transistors 500_4 can include a seventh transistor M1 over the sixth transistor M0 and an eighth transistor M5 over the seventh transistor M1. Further, the layout 500 can include a first BPR 502 that is applied with an operation voltage VSS, a second BPR 504 that is applied with an operation voltage VDD, and a third BPR 506 that is applied with the operation voltage VSS. In some embodiments, the second BPR 504 can be arranged between the first and second BPRs 502 and 506.

In addition, the first capacitor C1 and the second capacitor C2 in layout 500 can be the deep trench capacitors that are adjacent to the first BPR 502 and the third BPR 506 respectively. A positive polarity of the first capacitor C1 can be coupled to a source terminal of the first transistor M6 and a negative polarity of the first capacitor C1 can be coupled to the first BPR 502 on which the operation voltage VSS is applied. A positive polarity of the second capacitor C2 can be coupled to a source terminal of the fifth transistor M7 and a negative polarity of the second capacitor C2 can be coupled to the third BPR 506 on which the operation voltage VSS is applied. Further, the second BPR 504 can be coupled to a source terminal of the third transistor M3 and a source terminal of the seventh transistor M1, and applied with the VDD. A source terminal of the second transistor M2 and a source terminal of the sixth transistor M0 can be coupled to one of the first and third BPRs 502 and 506 on which the operation voltage VSS is applied on.

In some embodiments, the transistors M0-M7 can have similar device parameters (e.g., widths, lengths, and n-type/p-type) to the transistors M0-M7 shown in FIG. 3. The capacitors C1 and C2 can have similar device parameters (e.g., dimensions or capacitance) to the capacitors C1 and C2 shown in FIG. 3. Accordingly, the second transistor M2, the third transistor M3, and the fourth transistor M4 in the stack 500A, and the sixth transistors M0, the seventh transistor M1, and eighth transistor M5 in the stack 500B can form the SRAM cell 300A shown in FIG. 3. In addition, the second transistor M2 and the third transistor M3 in the stack 500A can form a first inverter of the SRAM cell 300A, and the sixth transistor M0 and the seventh transistor M1 in stack 500B can form a second inverter of the SRAM cell 300A. The first invertor and the second invertor are coupled to each other as shown in FIG. 3. Further, the first transistor M6 in the stack 500A can be coupled to the first capacitor C1 to form the first DRAM cell 300B, and the second transistor M7 in the stack 500B can be coupled to the second capacitor C2 to form the second DRAM cell 300C. Similar to FIG. 3, the second transistor M2 in stack 500A and the sixth transistor M0 in the stack 500B can be coupled to one of the first BPR 502 and the third BPR 506 and applied with the operation voltage VSS. The third transistor M3 in the stack 500A and the seventh transistor M1 in stack 500B can be coupled to the second BPR 504 and applied with the operation voltage VDD.

The cross-sectional layout 500 of the memory cell 300 can also include a plurality of interconnect structures (not shown), such as the interconnect structures 412 in FIG. 4, that can be positioned over the fourth transistor M4 and the eighth transistor M5. The interconnect structures can function as the bit lines (e.g., 308 and 310) and the word lines (302-306) that are coupled to the corresponding transistors according to the circuit diagram shown in FIG. 3. Thus, moving to the bottom device (e.g., M6 and M7) in the transistor stack (e.g., 500A and 500B), there are access devices (e.g., M6 and M7) for the DRAM bit cells (or DRAM cells 300B and 300C). Above the DRAM bit cell access device (e.g., M6 and M7), there are two devices (e.g., M2 and M3) that form the cross-coupled inverter of the SRAM cell 300A. At the top of the device stack are the two SRAM access devices (e.g., M4 and M5) for the BL and BLB signals.

FIG. 5 also shows the location of the Deep Trench (DT) capacitors C1 and C2. The buried power rails (VDD, VSS) 502-506 are a part of the 3.4 technology. The DT capacitors C1 and C2 for the DRAM bit cells are shown abutting the VSS power rails (or BPR 502 and BPR 506) respectively. The 3.4 technology needs very high aspect ratio (e.g., 40:1) structures to build the capacitor size needed for the DRAM bit cell below the access devices (e.g., transistors M6 and M7).

Figure 6:
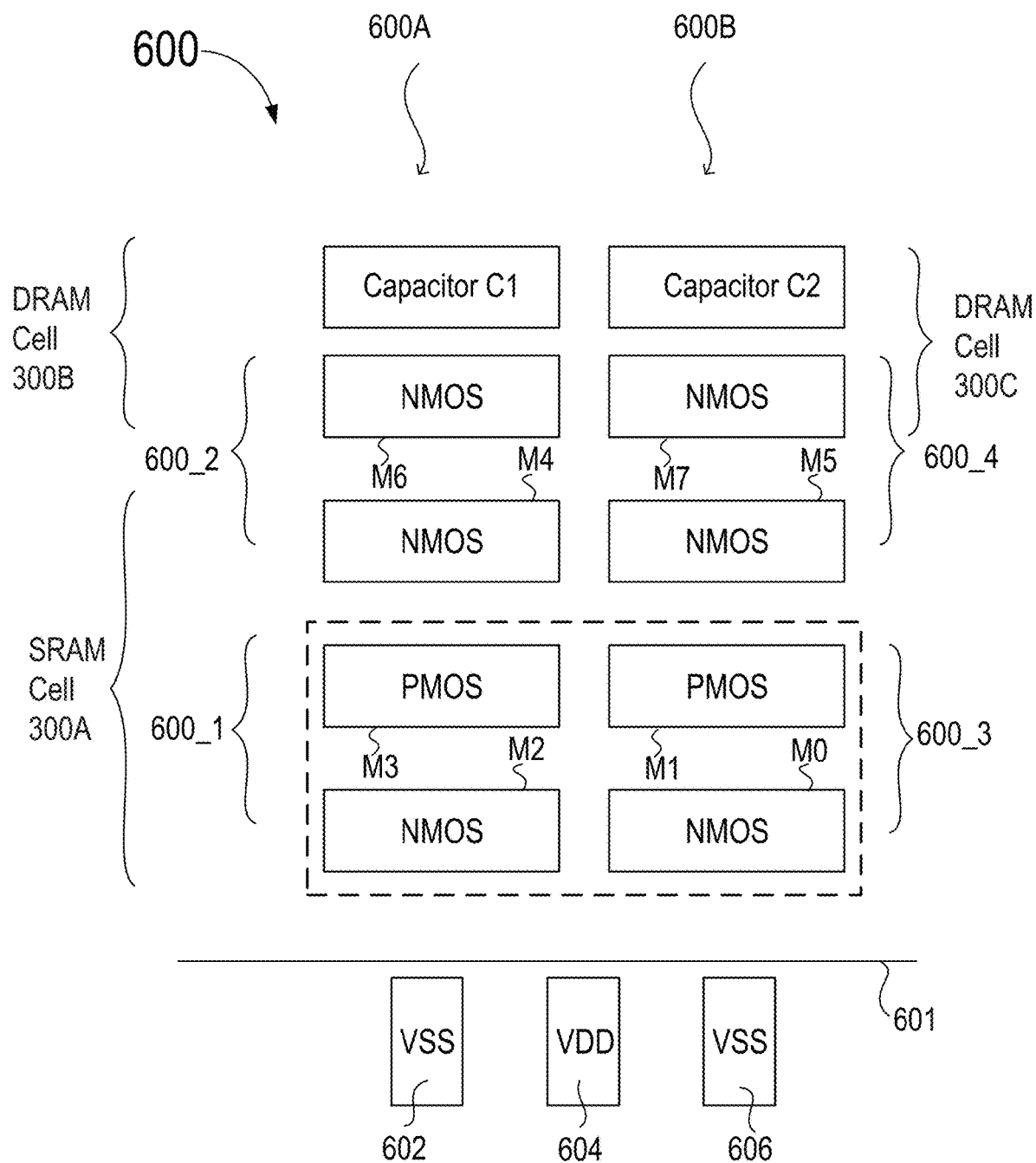
FIG. 6 is a cross-sectional view of a second exemplary memory cell based on a combination of a SRAM memory cell and DRAM memory cells, in accordance with some embodiments.

FIG. 6 shows a second example cross-sectional layout (or layout) 600 of the memory cell 300 that is shown in FIG. 3. Compared to the layout 500, capacitors in the layout 600 can be positioned over the transistors rather than in the substrate. As shown in the layout 600, the memory cell 300 can be formed based on two stack of transistors (or stacks) 600A and 600B. The stack 600A can include a first CFET that includes a first pair of transistors 600_1 over a substrate 601 and a second CFET that includes a second pair of transistors 600_2 over the first pair of transistors 600_1. The first pair of transistors 600_1 can includes a first transistor M2 over the substrate 601 and a second transistor M3 over the first transistor M2. The second pair of transistors 6002 includes a third transistor M4 over the second transistor M3 and a fourth transistor M6 over the third transistor M4. The stack 600B can include a third CFET that includes a third pair of transistors 600_3 over the substrate 601 and a fourth CFET that includes a fourth pair of transistors 600_4 over the third pair of transistors 600_3. The third pair of transistors 6003 can includes a fifth transistor M0 over the substrate 601 and a sixth transistor M1 over the first transistor M0. The fourth pair of transistors 600_4 can include a seventh transistor M5 over the sixth transistor M1 and an eighth transistor M7 over the seventh transistor M5. Further, the memory cell 300 can includes a first power rail 602 that is applied with an operation voltage VSS, a second power rail 604 that is applied with an operation voltage VDD, and a third power rail 606 that is applied with the operation voltage VSS. In some embodiments, the second power rail 604 can be arranged between the first and second power rails 602 and 606. The first power rail 602, the second power rail 604, and the third power rails 606 can be buried power rails that are buried in the substrate 601. In addition, a first capacitor C1 can be positioned over the fourth transistor M6 in the stack 600A and a second capacitor C2 can be positioned over the eight transistor M7 in the stack 600B.

In some embodiments, the transistors M0-M7 can have similar device parameters (e.g., widths, lengths, and n-type/p-type) to the transistors M0-M7 shown in FIG. 3. The capacitors C1 and C2 can have similar capacitance to the capacitors C1 and C2 shown in FIG. 3. The first transistor M2, the second transistor M3, and the third transistor M4 in the stack 600A and the fifth transistor M0, the sixth transistor M1, and the seventh transistor M5 in the stack 600B can form the SRAM cell 300A shown in FIG. 3. In addition, the first transistor M2 and the second transistor M3 in the stack 600A can form a first inverter of the SRAM cell 300A, and the fifth transistor M0 and the sixth transistor M1 in stack 600B can forma second inverter of the SRAM cell 300A. The first invertor and the second invertor are coupled to each other as shown in FIG. 3. Further, the fourth transistor M6 in the stack 600A can be coupled to the first capacitor C1 to form the first DRAM cell 300B, and the eighth transistor M7 in the stack 600B can be coupled to the second capacitor C2 to form the second DRAM cell 300C. Similar to FIG. 3, a source terminal of the first transistor M2 in stack 600A and a source terminal of the fifth transistor M0 in the stack 600B can be coupled to one of the first power rail 602 and the third power rail 606 and coupled to the operation voltage VSS. A source terminal of the second transistor M3 in the stack 600A and a source terminal of the sixth transistor M1 in stack 600B can be coupled to the second power rail 604 and coupled to the operation voltage VDD. A positive polarity of the first capacitor C1 can be coupled to a source terminal of the fourth transistor M6 and a negative polarity of the first capacitor C1 can be coupled to one of the first power rail 602 and the third power rail 606 on which the operation voltage VSS is applied. A positive polarity of the second capacitor C2 can be coupled to a source terminal of the eighth transistor M7 and a negative polarity of the second capacitor C2 can be coupled to one of the first power rail 602 and the third power rail 606 on which the operation voltage VSS is applied.

It should be noted that the power rails 602-604 can also be positioned over the first and second capacitors C1 and C2. The layout 600 of the memory cell 300 can include a plurality of interconnect structures (not shown), such as the interconnect structures 412 in FIG. 4, that can be positioned over the first and second capacitors C1 and C2. The interconnect structures can function as the bit lines (e.g., 308 and 310) and the word lines (302-306) that are coupled to the corresponding transistors according to the circuit diagram shown in FIG. 3. In addition, the first and second capacitors C1 and C2 can have different structures to the first and second capacitors C1 and C2 shown in FIG. 5. For example, in an embodiment, the first capacitor C1 and the second capacitor C2 can have a plate profile such that the first capacitor C1 and the second capacitor C2 can be metal-insulating-metal capacitors (MIMCap) that extend along a top surface of the substrate 601. In another embodiment, the first capacitor C1 and the second capacitor C2 can be stacked capacitors such that the first capacitor C1 and the second capacitor C2 can still have a trench profile extending along a vertical direction perpendicular to the substrate but are formed in a dielectric stack. The dielectric stack can be positioned over the fourth and eighth transistors M6 and M7.

The new memory cell (e.g., 300) herein triples the capacity of memory with no additional cell footprint over the SRAM cell size. The support circuitry needed, however, will increase beyond what is typical for SRAM design. The design of the disclosure uses three word line signals with the associated address management. The bit line and sense amp design are configured to accommodate the electrical requirements of reading and writing both an SRAM cell and DRAM cells. Finally, the entire array is configured to support refresh requirements of DRAM cells.

This novel memory cell can be used in the cache subsystem in several ways. For example, when the SRAM bit cell comprises a conventional L1 cache, and the two DRAM bits comprise a novel L2 cache. A cache miss in the L1 level of the memory would force a read from the L2. In a conventional system this would incur a 10 cycle penalty. With techniques herein, however, the L2 (e.g., DRAM bits) is accessed in less than half that time (depending on other factors). Reducing the L2 cache latency by roughly half provides a dramatic improvement of the overall processor performance.

As can be appreciated, many alternative configurations are contemplated here. For example, techniques herein can be applied to other forms of memory including MRAM (Magnetoresistive Random Access Memory), RRAM (Resistive Random Access Memory), etc. in various stackable configurations. Capacitors on top of the SRAM (e.g. MIMCap or stacked capacitor) can be used instead of DT capacitor for those technologies not using BSP (Back Side Power). DRAM cells can be used both below and above the SRAM cell. For example, the DRAM cells can be positioned below the SRAM cell in FIG. 5 and above the SRAM cell in FIG. 6.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
a first stack of transistors positioned over a top surface of a substrate, the first stack of transistors including a first pair of transistors and a second pair of transistors that are stacked over the substrate;
a second stack of transistors positioned over the top surface of the substrate and adjacent to the first stack of transistors, the second stack of transistors including a third pair of transistors and a fourth pair of transistors that are stacked over the substrate;
a first capacitor that is stacked with the first stack of transistors and the second stack of transistors; and
a second capacitor that is positioned adjacent to the first capacitor and stacked with the first stack of transistors and the second stack of the transistors, wherein:
a first group of the transistors in the first stack of transistors and the second stack of transistors are coupled to each other to form a static random-access memory (SRAM) cell, and
a second group of the transistors in the first stack of the transistors and the second stack of transistor are coupled to the first capacitor and the second capacitor to form a first dynamic random-access memory (DRAM) cell and a second DRAM cell that are stacked with and coupled to the SRAM cell.

2. The semiconductor device of claim 1, wherein:
the first pair of transistors includes a first transistor over the substrate and a second transistor over the first transistor,
the second pair of transistors includes a third transistor over the second transistor and a fourth transistor over the third transistor,
the third pair of transistors includes a fifth transistor over the substrate and a sixth transistor over the fifth transistor, and
the fourth pair of transistors includes a seventh transistor over the sixth transistor and an eighth transistor over the seventh transistor.

3. The semiconductor device of claim 2, wherein:
each of the transistors in the first and second stacks includes (i) one or more channel regions, the one or more channel regions extending along a horizontal direction parallel to the top surface of the substrate, being stacked over the substrate along a vertical direction perpendicular to the top surface of the substrate, and being spaced apart from each other, and (ii) a gate region around the one or more channel regions.

4. The semiconductor device of claim 3, wherein:
the first group of the transistors in the first stack of transistors and the second stack of transistors includes the second, third, fourth, sixth, seventh, and eighth transistors, and
the second group of the transistors in the first stack of transistors and the second stack of transistors includes the first and fifth transistors.

5. The semiconductor device of claim 4, wherein:
the first capacitor has a trench profile, extends into the substrate from the top surface of the substrate, and is positioned in the substrate,
the second capacitor has a trench profile, extends into the substrate from the top surface of the substrate, and is positioned in the substrate,
the first capacitor is coupled to the first transistor to form the first DRAM cell, and
the second transistor is coupled to the fifth transistor to form the second DRAM cell.

6. The semiconductor device of claim 5, wherein:
the second transistor is an n-type transistor and the third transistor is a p-type transistor, the second and third transistors forming a first invertor structure of the SRAM cell,
the sixth transistor is an n-type transistor and the seventh transistor is a p-type transistor, the sixth and seventh transistors forming a second invertor structure of the SRAM cell, the first invertor structure and the second invertor structure being cross-coupled,
the fourth transistor is an n-type transistor that functions as a first access transistor of the SRAM cell and coupled to the first invertor structure, and
the eighth transistor is an n-type transistor that functions as a second access transistor of the SRAM cell and coupled to the second invertor structure.

7. The semiconductor device of claim 5, further comprising:
a first buried power rail (BPR) that is positioned in the substrate, adjacent to and coupled to the first capacitor, and applied with a source supply voltage (VSS),
a second BPR that is positioned in the substrate, coupled to a source region of the third transistor and a source region of the seventh transistor, and applied with a drain supply voltage (VDD), and
a third BPR that is positioned in the substrate, adjacent to and coupled to the second capacitor, and applied with the VSS.

8. The semiconductor device of claim 6, further comprising:
a first interconnect structure that functions as a first bit line and is coupled to a source region of the first transistor and a source region of the fourth transistor,
a second interconnect structure that functions as a second bit line and is coupled to a source region of the fifth transistor and a source region of the eighth transistor,
a third interconnect structure that functions as a word line for the SRAM cell and is coupled to a gate region of the fourth transistor and a gate region of the eighth transistor,
a fourth interconnect structure that functions as a word line for the first DRAM cell and is coupled to a gate region of the first transistor, and
a fifth interconnect structure that functions as a word line for the second DRAM cell and is coupled to a gate region of the fifth transistor.

9. The semiconductor device of claim 3, wherein:
the first group of the transistors in the first stack of transistors and the second stack of transistors includes the first, second, third, fifth, sixth, and seventh transistors, and
the second group of the transistors in the first stack of transistors and the second stack of transistors includes the fourth and eighth transistors.

10. The semiconductor device of claim 9, wherein:
the first transistor is an n-type transistor and the second transistor is a p-type transistor, the first and second transistors forming a first invertor structure of the SRAM cell,
the fifth transistor is an n-type transistor and the sixth transistor is a p-type transistor, the fifth and sixth transistors forming a second invertor structure of the SRAM cell, the first invertor structure and the second invertor structure being cross-coupled,
the third transistor is an n-type transistor that functions as a first access transistor of the SRAM cell and coupled to the first invertor structure, and
the seventh transistor is an n-type transistor that functions as a second access transistor of the SRAM cell and coupled to the second invertor structure.

11. The semiconductor device of claim 10, wherein:
the first capacitor is positioned over the fourth transistor and has one of a trench profile extending in the vertical direction and a plate profile extending in the horizontal direction,
the second capacitor is positioned over the eighth transistor and has one of a trench profile extending in the vertical direction and a plate profile extending in the horizontal direction,
the first capacitor is coupled to the fourth transistor to form the first DRAM cell, and
the second capacitor is coupled to the eighth transistor to form the second DRAM cell.

12. The semiconductor device of claim 11, further comprising:
a first interconnect structure that functions as a first bit line and is coupled to a source region of the third transistor and a source region of the fourth transistor,
a second interconnect structure that functions as a second bit line and is coupled to a source region of the seventh transistor and a source region of the eighth transistor,
a third interconnect structure that functions as a word line for the SRAM cell and is coupled to a gate region of the third transistor and a gate region of the seventh transistor,
a fourth interconnect structure that functions as a word line for the first DRAM cell and is coupled to a gate region of the fourth transistor, and
a fifth interconnect structure that functions as a word line for the second DRAM cell and is coupled to a gate region of the eighth transistor.

13. The semiconductor device of claim 11, further comprising:
a first buried power rail (BPR) that is positioned in the substrate, coupled to the first capacitor, and applied with a source supply voltage (VSS),
a second BPR that is positioned in the substrate, coupled to a source region of the second transistor and a source region of the sixth transistor, and applied with a drain supply voltage (VDD), and
a third BPR that is positioned in the substrate, coupled to the second capacitor, and applied with the VSS.

14. A method of manufacturing a semiconductor device, comprising:
forming a first stack of transistors over a top surface of a substrate, the first stack of transistors including a first pair of transistors and a second pair of transistors that are stacked over the substrate;
forming a second stack of transistors over the substrate and adjacent to the first stack of transistors, the second stack of transistors including a third pair of transistors and a fourth pair of transistors that are stacked over the substrate;
forming a first capacitor that is stacked with the first stack of transistors and the second stack of the transistors; and
forming a second capacitor that is positioned adjacent to the first capacitor and stacked with the first stack of transistors and the second stack of the transistors, wherein:
a first group of the transistors in the first stack of transistors and the second stack of transistors are coupled to each other to form a static random-access memory (SRAM) cell, and a second group of the transistors in the first stack of the transistors and the second stack of transistor are coupled to the first capacitor and the second capacitor to form a first dynamic random-access memory (DRAM) cell and a second DRAM cell that are stacked with and coupled to the SRAM cell.

15. The method of claim 14, wherein:
the first pair of transistors includes a first transistor over the substrate and a second transistor over the first transistor,
the second pair of transistors includes a third transistor over the second transistor and a fourth transistor over the third transistor,
the third pair of transistors includes a fifth transistor over the substrate and a sixth transistor over the fifth transistor, and
the fourth pair of transistors includes a seventh transistor over the sixth transistor and an eighth transistor over the seventh transistor.

16. The method of claim 15, wherein:
each of the transistors in the first and second stacks includes (i) one or more channel regions, the one or more channel regions extending along a horizontal direction parallel to the top surface of the substrate, being stacked over the substrate along a vertical direction perpendicular to the top surface of the substrate, and being spaced apart from each other, and (ii) a gate region around the one or more channel regions.

17. The method of claim 16, wherein the forming the first and second capacitors comprise:
forming the first capacitor has a trench profile, extends into the substrate from the top surface of the substrate, and is positioned in the substrate, and
forming the second capacitor has a trench profile, extends into the substrate from the top surface of the substrate, and is positioned in the substrate, wherein
the first capacitor is coupled to the first transistor to form the first DRAM cell,
the second transistor is coupled to the fifth transistor to form the second DRAM cell.

18. The method of claim 17, wherein:
the second transistor is an n-type transistor and the third transistor is a p-type transistor, the second and third transistors forming a first invertor structure of the SRAM cell, the sixth transistor is an n-type transistor and the seventh transistor is a p-type transistor, the sixth and seventh transistors forming a second invertor structure of the SRAM cell, the first invertor structure and the second invertor structure being cross-coupled,
the fourth transistor is an n-type transistor that functions as a first access transistor of the SRAM cell and coupled to the first invertor structure, and
the eighth transistor is an n-type transistor that functions as a second access transistor of the SRAM cell and coupled to the second invertor structure.

19. The method of claim 17, further comprising:
forming a first buried power rail (BPR) that is positioned in the substrate, adjacent to and coupled to the first capacitor, and applied with a source supply voltage (VSS),
forming a second BPR that is positioned in the substrate, coupled to a source region of the third transistor and a source region of the seventh transistor, and applied with a drain supply voltage (VDD), and
forming a third BPR that is positioned in the substrate, adjacent to and coupled to the second capacitor, and applied with the VSS.

20. The method of claim 17, further comprising:
forming a first interconnect structure that functions as a first bit line and is coupled to a source region of the first transistor and a source region of the fourth transistor,
forming a second interconnect structure that functions as a second bit line and is coupled to a source region of the fifth transistor and a source region of the eighth transistor,
forming a third interconnect structure that functions as a word line for the SRAM cell and is coupled to a gate region of the fourth transistor and a gate region of the eighth transistor,
forming a fourth interconnect structure that functions as a word line for the first DRAM cell and is coupled to a gate region of the first transistor, and
forming a fifth interconnect structure that functions as a word line for the second DRAM cell and is coupled to a gate region of the fifth transistor.

* * * * *

UNITED STATES PATENT AND TRADEMARK OFFICE
CERTIFICATE OF CORRECTION

PATENT NO. : 11,723,187 B2  
APPLICATION NO. : 17/644982  
DATED : August 8, 2023  
INVENTOR(S) : Gutwin et al.

Page 1 of 1

It is certified that error appears in the above-identified patent and that said Letters Patent is hereby corrected as shown below:

On the Title Page

Column 1, Item (72), in "Inventors", Line 2, delete "Mechanicsville," and insert -- Mechanicville, --, therefor.

Column 2, Item (57), under "ABSTRACT", Line 1, after "over", insert -- the --.

Signed and Sealed this  
Thirtieth Day of January, 2024

Katherine Kelly Vidal  
*Director of the United States Patent and Trademark Office*